United States Patent
Sun et al.

(10) Patent No.: US 9,721,714 B1
(45) Date of Patent: Aug. 1, 2017

(54) ELECTROMAGNET AND FLEXIBLE CIRCUIT BOARD

(71) Applicant: ICHIA TECHNOLOGIES, INC., Taoyuan (TW)

(72) Inventors: Yung-Hsiang Sun, Taoyuan (TW); Kung-Sheng Tseng, Taoyuan (TW); Hsueh-Yuan Fan, Taoyuan (TW); Chia-Hua Chiang, Taoyuan (TW)

(73) Assignee: ICHIA TECHNOLOGIES, INC., Taoyuan (TW)

( * ) Notice: Subject to any disclaimer, the term of this patent is extended or adjusted under 35 U.S.C. 154(b) by 0 days.

(21) Appl. No.: 15/229,148

(22) Filed: Aug. 5, 2016

(30) Foreign Application Priority Data

May 25, 2016 (TW) .............................. 105116264 A (51) Int. Cl.
H01F 27/28 (2006.01)
H01F 7/20 (2006.01)
H05K 1/02 (2006.01)
H01F 7/06 (2006.01)

(52) U.S. Cl.
CPC ........... *H01F 7/20* (2013.01); *H01F 27/2804* (2013.01); *H05K 1/028* (2013.01); *H01F 2007/068* (2013.01)

(58) Field of Classification Search
CPC ..................... H01F 17/0013; H01F 2017/0066
USPC ................................................. 336/206, 229
See application file for complete search history.

(56) References Cited

U.S. PATENT DOCUMENTS

| | | | | |
|---|---|---|---|---|
| 2,435,093 A | * | 1/1948 | Mitschrich | H01F 27/323 174/209 |
| 4,472,703 A | * | 9/1984 | Blackman | H02K 3/325 310/45 |
| 6,040,753 A | * | 3/2000 | Ramakrishnan | H01F 17/0033 336/200 |
| 6,573,820 B2 | * | 6/2003 | Yamada | H01F 27/2804 336/184 |
| 2001/0043135 A1 | * | 11/2001 | Yamada | H01F 27/2804 336/184 |
| 2003/0020584 A1 | * | 1/2003 | Lee | H01F 27/2804 336/200 |
| 2006/0214759 A1 | * | 9/2006 | Kawarai | H01F 17/0006 336/200 |
| 2008/0001700 A1 | * | 1/2008 | Pardo | H01F 17/0006 336/200 |

(Continued)

Primary Examiner — Alexander Talpalatski
(74) Attorney, Agent, or Firm — Li & Cai Intellectual Property (USA) Office (57) ABSTRACT

A flexible circuit board includes a substrate and a circuit unit formed on the substrate. The substrate has two carrying segments and a connecting segment, and the two carrying segments are connected by the connecting segment. The circuit unit has a plurality of conductive lines and at least one connecting line, and each conductive line and the connecting line are separated from each other. The conductive lines are respectively formed on the two carrying segments, and the connecting line is formed on the connecting segment and the two carrying segments. Two opposite ends of each carrying segment are configured to connect with each other to form a tubular structure, and two opposite ends of the connecting line are configured to connect to two adjacent conductive lines respectively formed on the two tubular structures, thereby the circuit unit is formed as a coil.

10 Claims, 7 Drawing Sheets

(56) References Cited

U.S. PATENT DOCUMENTS

| | | | |
|---|---|---|---|
| 2011/0285492 A1* | 11/2011 | Wang ................... | H01F 27/306 336/198 |
| 2014/0232502 A1* | 8/2014 | Gutierrez ............ | H01F 27/2804 336/200 |
| 2014/0232503 A1* | 8/2014 | Gutierrez ............ | H04F 17/0033 336/200 |

* cited by examiner

ELECTROMAGNET AND FLEXIBLE CIRCUIT BOARD

BACKGROUND OF THE INVENTION

1. Field of the Invention

The instant invention relates to an electromagnet; in particular, to an electromagnet and a flexible circuit board.

2. Description of Related Art

The conventional electromagnet is formed by winding a metallic wire around a core, so the metallic wire is formed into a coil. However, the conventional electromagnet is limited to the cooperation of the metallic wire and the core, so the volume of the conventional electromagnet cannot be reduced and the production efficiency of the conventional electromagnet cannot be increased.

SUMMARY OF THE INVENTION

The instant disclosure provides an electromagnet and a flexible circuit board for effectively improving the above problem generated from the conventional electromagnet.

The instant disclosure provides an electromagnet, comprising: an ring-shaped core; and a flexible circuit board, comprising: a substrate including two carrying segments and a connecting segment, wherein the connecting segment connects the two carrying segments; and a circuit unit formed on the substrate and including a plurality of conductive lines and a connecting line, wherein each conductive line and the connecting line are independent lines, the conductive lines are respectively formed on the two carrying segments, and the connecting segment is formed on the connecting segment and the two carrying segments; wherein two opposite end portions of each carrying segment are connected to each other to construct a tubular structure, and two opposite ends of the connecting line are respectively connected to two adjacent conductive lines respectively formed on the two tubular structures, so the conductive lines and the connecting line are in a series connection to construct a coil; wherein the tubular structures are sleeved at the core, and the coil is wound around the core, wherein the coil is configured to receive a current for making the core have magnetism.

The instant disclosure also provides a flexible circuit board, comprising: a substrate including two carrying segments and a connecting segment, wherein the connecting segment connects the two carrying segments; and a circuit unit formed on the substrate and including a plurality of conductive lines and a connecting line, wherein each conductive line and the connecting line are independent lines, the conductive lines are respectively formed on the two carrying segments, and the connecting segment is formed on the connecting segment and the two carrying segments; wherein two opposite end portions of each carrying segment are configured to connect to each other to construct a tubular structure, and two opposite ends of the connecting line are configured to respectively connect to two adjacent conductive lines respectively formed on the two tubular structures, so the conductive lines and the connecting line are configured in a series connection to construct a coil.

The instant disclosure further provides a flexible circuit board, comprising: a substrate, wherein two opposite end portions of the substrate are connected to each other to construct a tubular structure; and a plurality of conductive lines formed on the substrate and being independent lines, wherein the conductive lines are connected in a series connection to construct a coil.

In summary, the flexible circuit board of the electromagnet in the instant disclosure is provided to replace the conventional coil, which is formed by winding a metallic wire, thereby reducing the cost of the electromagnet and miniaturizing the electromagnet.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

First Embodiment

Please refer to FIGS. 1 through 7, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1:
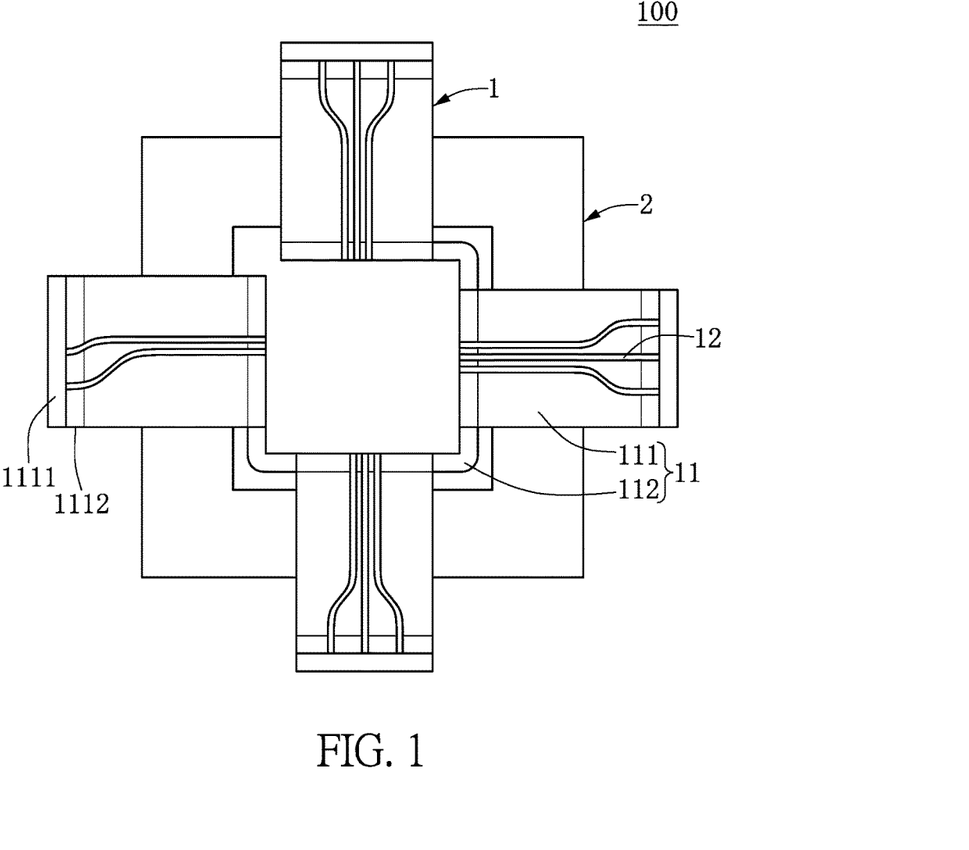
FIG. 1 is a top view showing an electromagnet according to a first embodiment of the instant disclosure.
Figure 2:
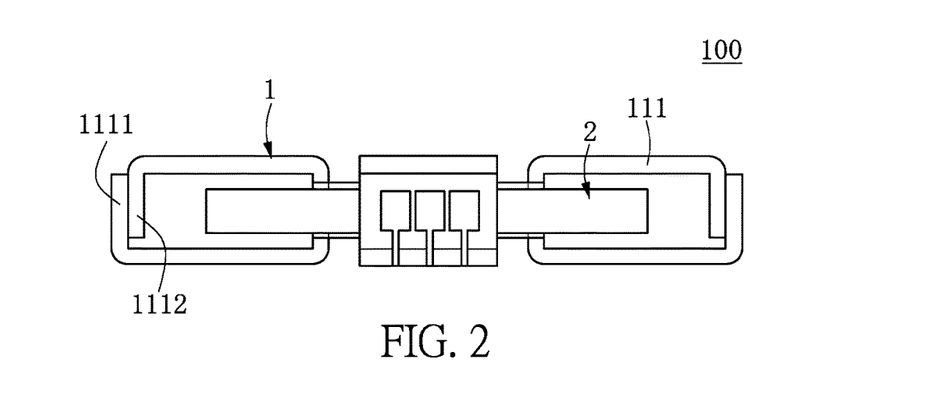
FIG. 2 is a side view showing an electromagnet according to the first embodiment of the instant disclosure.

Please refer to FIGS. 1 and 2, which show an electromagnet 100 including a flexible circuit board 1 and a core 2. The flexible circuit board 1 is sleeved at the core 2 and is configured to receive a current for making the core 2 have magnetism. In other words, the flexible circuit board 1 in the instant embodiment is provided to replace the conventional coil, which is formed by winding a metallic wire, thereby reducing the cost of the electromagnet 100 and miniaturizing the electromagnet 100. In order to clearly realize the electromagnet 100 of the instant embodiment, the following description discloses the flexible circuit board 1 in a planar mode first, but the construction of the flexible circuit board 1 is not limited thereto.

Figure 3:
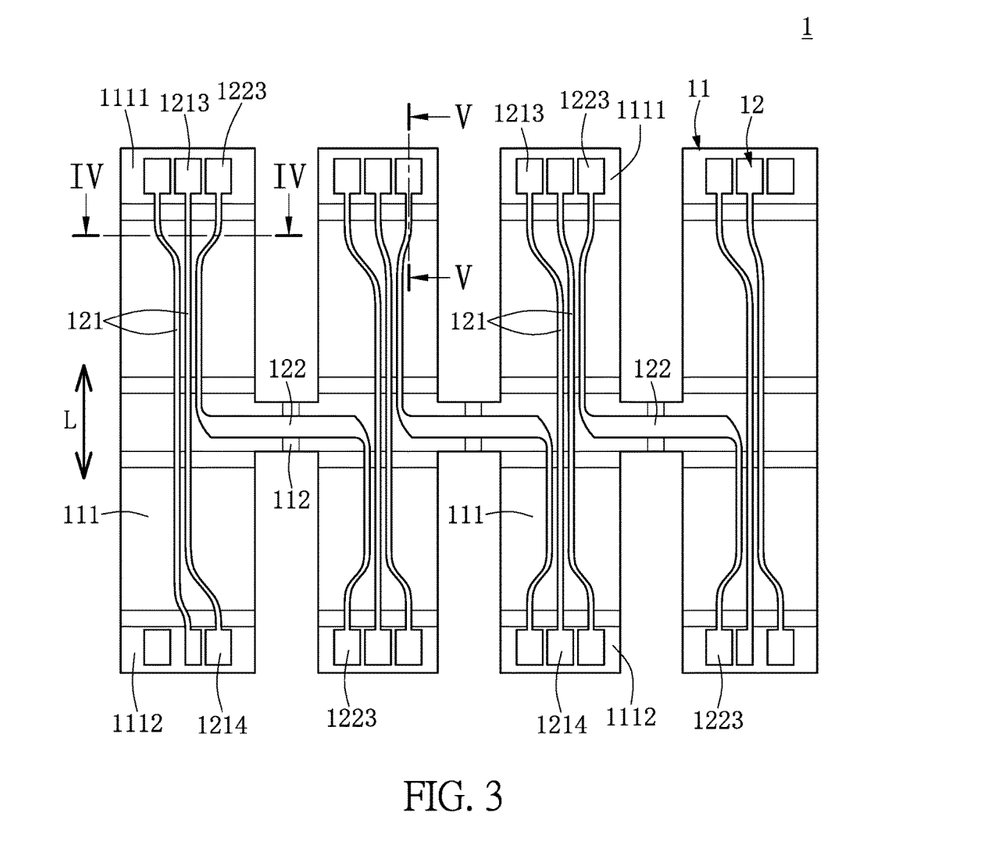
FIG. 3 is a planar view showing a flexible circuit board in a planar mode according to the first embodiment of the instant disclosure.

As shown in FIG. 3, the flexible circuit board 1 includes a substrate 11 and a circuit unit 12 formed on the substrate 11. The substrate 11 in the instant embodiment is made of polymide (PI). The substrate 11 includes a plurality of carrying segments 111 and a plurality of connecting segments 112, and any two adjacent carrying segments 111 are connected by using one connecting segment 112. The carrying segments 111 are elongated and parallel to each other, and any two adjacent carrying segments 111 and the corresponding connecting segment 112, which is connected to the two adjacent carrying segments 111, are formed in an H shape.

The circuit unit 12 in the instant embodiment is made of copper. The circuit unit 12 includes a plurality of conductive lines 121 and a plurality of connecting lines 122, and the conductive lines 121 and the connecting lines 122 are independent lines. In other words, any two of the independent lines are not connected to each other. The conductive lines 121 are respectively formed on the carrying segments 111, and any two adjacent carrying segments 111 and the corresponding connecting segment 112 arranged therebetween, which are formed in the H shape, are provided with one connecting line 122. Moreover, the number of the conductive lines 121 formed on each carrying segment 111 in the instant disclosure can be one (not shown) or more than one (shown in FIG. 3).

Figure 4:
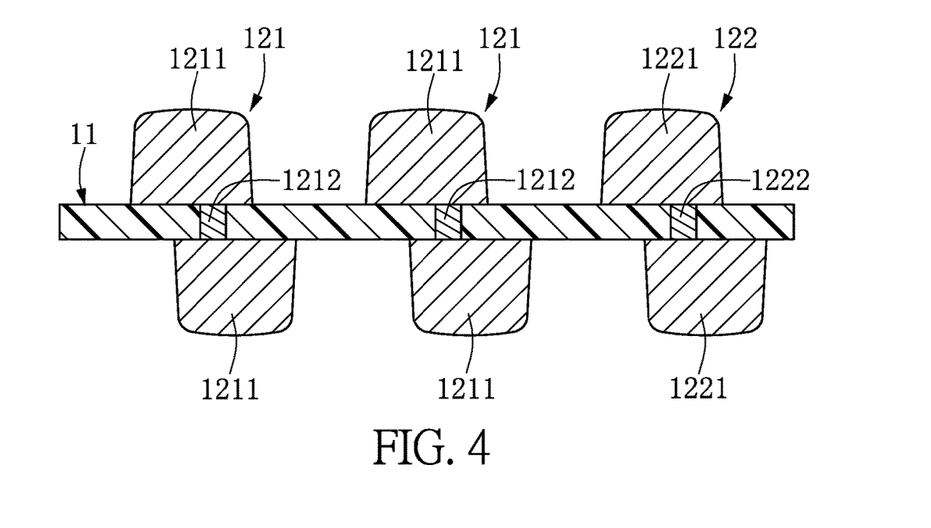
FIG. 4 is a cross-sectional view of FIG. 3 along a cross-sectional line IV-IV.

As shown in FIG. 3 and FIG. 4, each conductive line 121 includes two metallic layers 1211 and at least one connecting portion 1212 connecting the two metallic layers 1211. The two metallic layers 1211 of each conductive line 121 are respectively formed on two opposite surfaces of the substrate 11 (i.e., the top surface and the bottom surface of the substrate 11 shown in FIG. 4), and the connecting portion 1212 of each conductive line 121 is embedded in the substrate 11. Moreover, the two metallic layers 1211 of each conductive line 121 can be aligned with each other (not shown) or in a staggered arrangement (shown in FIG. 4). Accordingly, each conductive line 121 is prepared by forming the two metallic layers 1211 on the two opposite surfaces of the substrate 11, so the etching depth of each conductive line 121 can be reduced, thereby effectively improving the manufacturing process of each conductive line 121.

Figure 5:
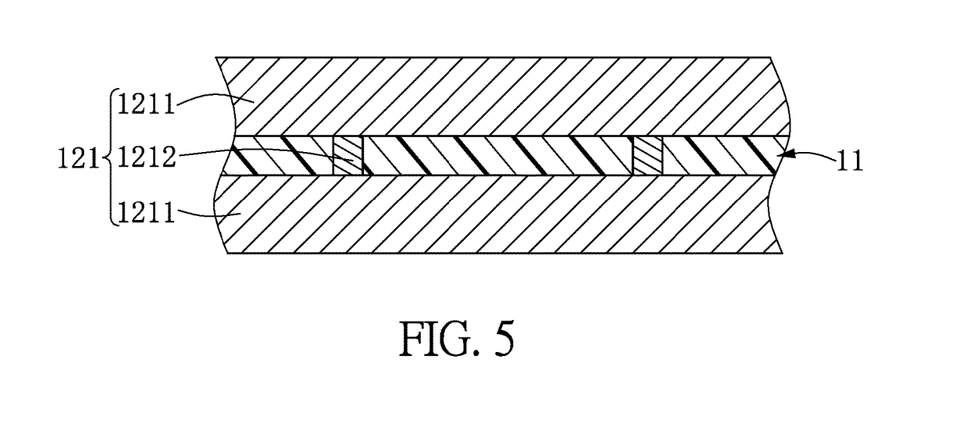
FIG. 5 is a cross-sectional view of FIG. 3 along a cross-sectional line V-V.
Figure 6:
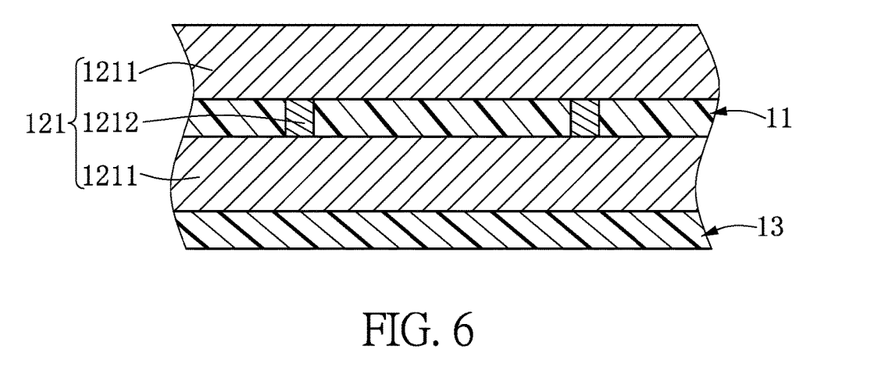
FIG. 6 is cross-sectional view showing a variety of FIG. 5.
Figure 7:
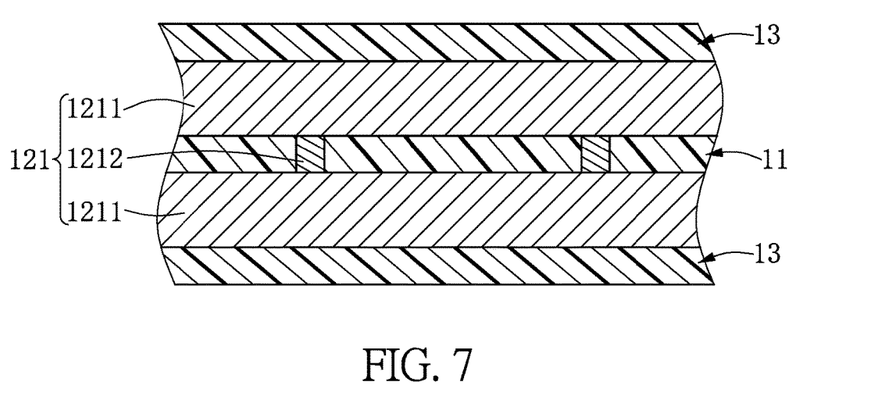
FIG. 7 is cross-sectional view showing another variety of FIG. 5.

Specifically, as shown in FIG. 5, the two metallic layers 1211 of each conductive line 121 can be only connected to the substrate 11 and the corresponding connecting portion 1212, that is to say, there is no construction formed on the two metallic layers 1211 of each conductive line 121, thus a thickness of the flexible circuit board 1 can be reduced. The thickness of the flexible circuit board 1 can be 100 μm~150 m, and the thickness of the flexible circuit board 1 shown in FIG. 5 is 125 μm. Moreover, as shown in FIG. 6, the flexible circuit board 1 can further include a bonding layer 13 formed on one of the two opposite surfaces of the substrate 11 to cover the corresponding metallic layers 1211. A thickness of the flexible circuit board 1 is 125 μm~175 μm, and the thickness of the flexible circuit board 1 shown in FIG. 6 is 150 μm. As shown in FIG. 7, the flexible circuit board 1 can further include two bonding layers 13 respectively formed on the two opposite surfaces of the substrate 11, and the metallic layers 1211 of the conductive lines 121 are embedded in the two bonding layers 13. A thickness of the flexible circuit board 1 is 150 μm~200 m, and the thickness of the flexible circuit board 1 shown in FIG. 7 is 175 μm.

In addition, the composition of the connecting line 122 is similar to that of the conductive line 121, that is to say, each connecting line 122 includes two metallic layers 1221 formed on the two opposite surfaces of the substrate 11 and at least one connecting portion 1222 connecting the two metallic layers 1221 and embedded in the substrate 11. Therefore, the instant embodiment does not introduce the composition of the connecting line 122 in detail.

Please refer to FIG. 3, which shows the layout of the circuit unit 12. The two opposite end portions of each carrying segment 111 include a first end portion 1111 and an opposite second end portion 1112 (i.e., the top end portion and the bottom end portion of each carrying segment 111 shown in FIG. 3). The first end portions 1111 of the substrate 11 are arranged in one row, and the second end portions 1112 of the substrate 11 are arranged in one row, that is parallel to the row of the first end portions 1111.

Each conductive line 121 is arranged from the first end portion 1111 to the second end portion 1112 of the corresponding carrying segment 111. Each conductive line 121 includes a first welding pad 1213 and a second welding pad 1214 arranged at two opposite ends thereof, and the first welding pad 1213 and the second welding pad 1214 of each conductive line 121 are respectively formed on the first end portion 1111 and the second end portion 1112 of the corresponding carrying segment 111. In other words, the first welding pads 1213 are arranged on the first end portions 1111 to be arranged in one row, and the second welding pads 1214 are arranged on the second end portions 1112 to be arranged in one row, that is parallel to the row of the first welding pads 1213. Specifically, each conductive line 121 defines a virtual line (not shown) passing through the first welding pad 1213 and the second welding pad 1214 thereof, and each virtual line and a longitudinal direction L of the corresponding carrying segment 111 have an acute angle (not labeled). In other words, the first welding pad 1213 and the second welding pad 1214 of each conductive line 121 are not simultaneously arranged in the longitudinal direction L.

For the H-shaped construction having two adjacent carrying segments 111 and the corresponding connecting segment 112, the connecting line 122 is arranged from the first end portion 1111 of one of the two adjacent carrying segments 111 to the second end portion 1112 of the other carrying segment 111 through the connecting segment 112 (shown in FIG. 3). Moreover, each connecting line 122 has two connecting pads 1223 respectively arranged on two opposite end portions thereof, and each connecting pad 1223 and one first welding pad 1213 (or one second welding pad 1214), which are arranged on the same carrying segment 111, are simultaneously arranged in the longitudinal direction L. In a non-shown embodiment, for the H-shaped construction having two adjacent carrying segments 111 and the corresponding connecting segment 112, the connecting line 122 is arranged from the first end portion 1111 of one of the two adjacent carrying segments 111 to the first end portion 1111 of the other carrying segment 111 through the connecting segment 112.

As shown in FIGS. 1 through 3, two opposite end portions of each carrying segment 111 are connected to each other to construct a tubular structure 111 (as shown in FIGS. 1 and 2), that is to say, each carrying segment 111 is bendable to overlap the first end portion 1111 onto the second end portion 1112 thereof. Moreover, two opposite ends of each connecting line 122 are respectively connected to two adjacent conductive lines 121 respectively formed on the two tubular structures 111, so all of the conductive lines 121 and the connecting lines 122 of the circuit unit 12 are in a series connection to construct a coil.

The above description has disclosed the flexible circuit board 1 of the instant embodiment, and the following description discloses the relative features of the flexible circuit board 1 and the core 2.

Please refer to FIGS. 1 through 3. The core 2 in the instant embodiment is a square ring shape, but the instant disclosure is not limited thereto. For example, the core 2 can be a circular ring shape, a triangular ring shape, an elongated strip, or an irregular construction. The core 2 in the instant embodiment includes a metallic core and an insulating layer covering the metallic core, and a thickness of the core 2 is approximately 400 μm.

The two opposite end portions of each carrying segment 111 are connected to each other to construct a tubular structure 111 (as shown in FIG. 2), and the two opposite ends of each connecting line 122 are respectively connected to two adjacent conductive lines 121 respectively formed on the two tubular structures 111, so all of the conductive lines 121 and the connecting lines 122 of the circuit unit 12 are in a series connection to construct the coil. Moreover, the tubular structures 111 are sleeved at the core 2 (i.e., the four rims of the core 2 respectively pass through the four tubular structures 111), such that the coil is wound around the core 2. The coil of the flexible circuit board 1 has two ends, one end is configured to receive a current, and the other end is configured to output the current, thereby making the core 2 have magnetism. Thus, the flexible circuit board 1 of the electromagnet 100 can be used to replace the conventional coil formed by using metallic wire, thereby reducing the cost of the electromagnet 100 and miniaturizing the electromagnet 100.

The first end portion 1111 and the second end portion 1112 of each carrying segment 111 are stacked with each other, and the pads arranged on each first end portion 1111 are respectively connected to (i.e., welded to) the pads arranged on the corresponding second end portion 1111. The conductive lines 121 formed on each tubular structure 111 are connected one by one in an end-to-end connection to construct a spiral shape, that is to say, the first welding pad 1213 of one of two adjacent conductive lines 121 formed on the same tubular structure is connected to the second welding pad 1214 of the other conductive line 121. Each connecting pad 1223 is connected to (i.e., welded to) the first welding pad 1213 (or the second welding pad 1214), which is arranged in the longitudinal direction L with the welded connecting pad 1223.

Moreover, the connecting segments 112 of the instant embodiment are arranged inside the core 2 and face toward an inner wall of the core 2, thereby receiving part of the flexible circuit board 1 by using the inner space of the core 2 to further miniaturize the electromagnet 100. Each tubular structure 111 is preferably abutted against the core 2 for reducing the thickness of the electromagnet 100.

Second Embodiment

Figure 8:
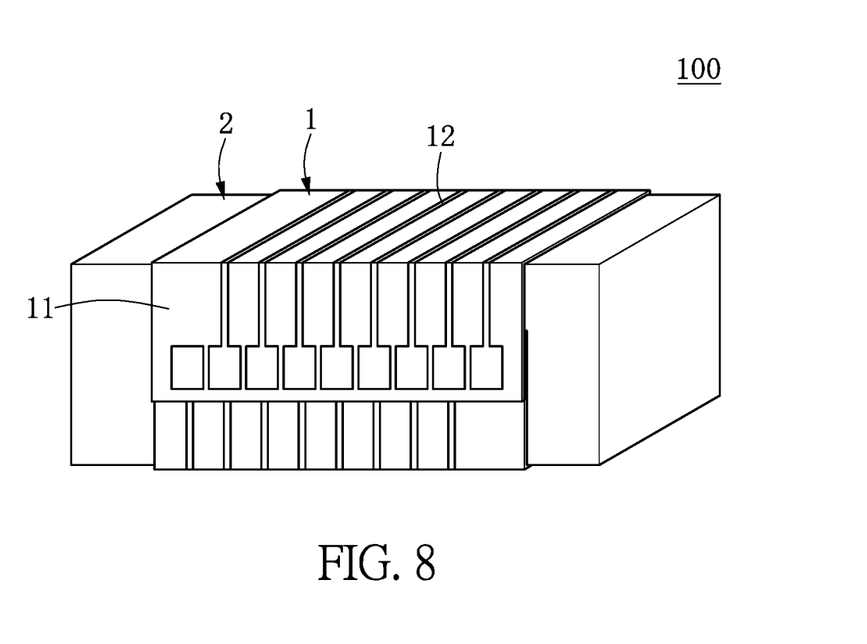
FIG. 8 is a perspective view showing an electromagnet according to a second embodiment of the instant disclosure.
Figure 9:
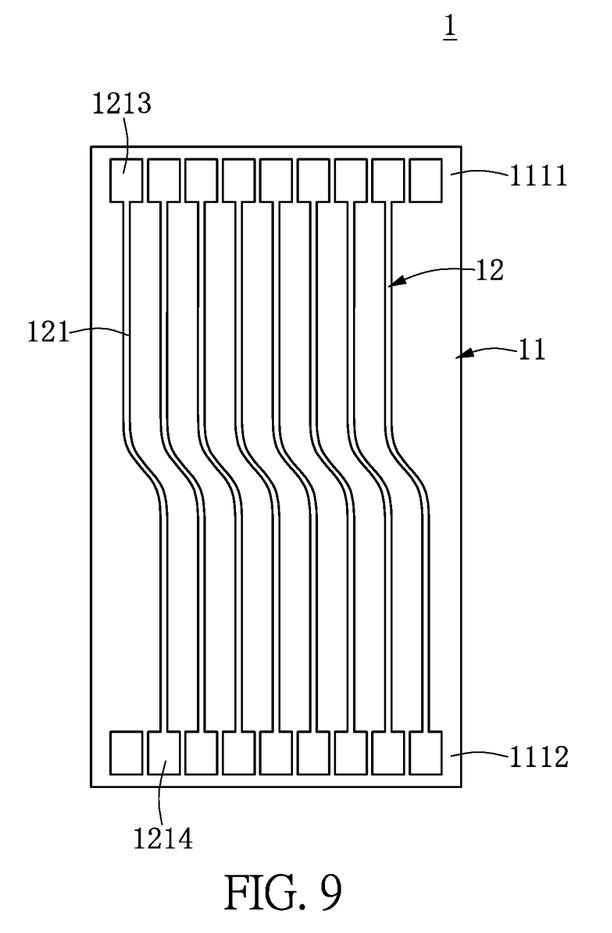
FIG. 9 is a planar view showing a flexible circuit board in a planar mode according to the second embodiment of the instant disclosure.
Figure 10:
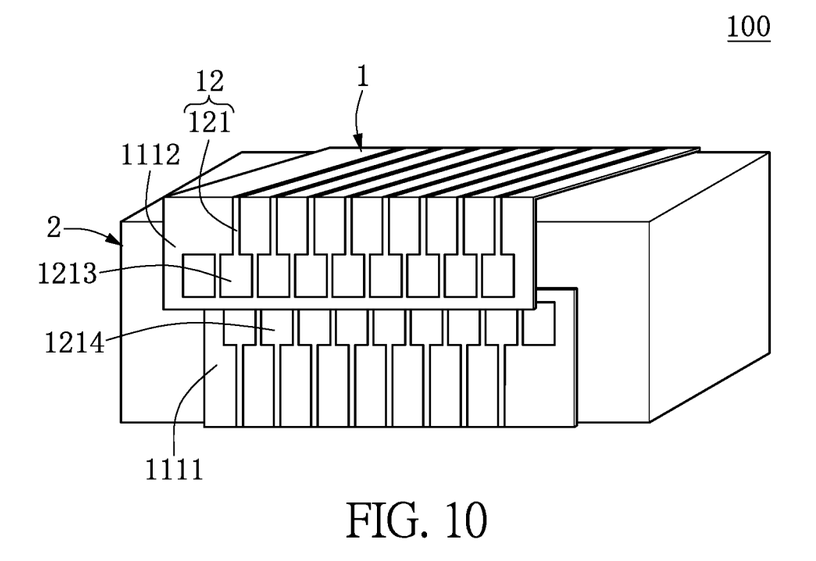
FIG. 10 is perspective view showing an installation process of FIG. 8 according to the second embodiment of the instant disclosure.

Please refer to FIGS. 8 through 10, which show a second embodiment of the instant disclosure. The second embodiment is similar to that of the first embodiment, so the same features of the two embodiments are not disclosed again. The different features of the two embodiments are disclosed as follows.

The electromagnet 100 in the instant embodiment includes a flexible circuit board 1 and an elongated core 2. The flexible circuit board 1 includes a substrate 11 and a plurality of conductive lines 121 formed on the substrate 11, and the conductive lines 121 are independent lines. The substrate 11 has a rectangular shape. Two opposite end portions of the substrate 11 (i.e., two shorter end portions of the substrate 11 shown in FIG. 9) are connected to construct a tubular structure 11, and the conductive lines 121 are connected in a series connection to construct a coil. Moreover, the core 2 includes a metallic core and an insulating layer covering the metallic core, and the core 2 is inserted into the tubular structure 11, so the coil of the flexible circuit board 1 has two ends, one end is configured to receive a current, and the other end is configured to output the current, thereby making the core 2 have magnetism.

Specifically, the two opposite end portions of the substrate 11 (i.e., two shorter end portions of the substrate 11 shown in FIG. 9) include a first end portion 1111 and a second end portion 1112. Each conductive line 121 is arranged from the first end portion 1111 to the second end portion 1112, and the first end portion 1111 and the second end portion 1112 of the tubular structure 11 are stacked with each other. Each conductive line 121 includes a first welding pad 1213 and a second welding pad 1214 arranged at two opposite ends thereof, and the first welding pad 1213 and the second welding pad 1214 of each conductive line 121 are respectively formed on the first end portion 1111 and the second end portion 1112. The first welding pad 1213 of one of two adjacent conductive lines 121 is connected to the second welding pad 1214 of the other conductive line 121.

Moreover, each conductive line 121 includes two metallic layers 1211 and at least one connecting portion 1212 connecting the two metallic layers 1211 (similar to FIG. 4). The two metallic layers 1211 of each conductive line 121 are respectively formed on two opposite surfaces of the substrate 11, and the connecting portion 1212 of each conductive line 121 is embedded in the substrate 11. Preferably, the metallic layers 1211 of each conductive line 121 are only connected to the substrate 11 and the corresponding connecting portion 1212, and a thickness of the flexible circuit board 1 is 100 μm~150 μm, but the instant disclosure is not limited thereto.

The Effect of the Instant Disclosure

In summary, the flexible circuit board of the electromagnet in the instant disclosure is provided to replace the conventional coil, which is formed by winding a metallic wire, thereby reducing the cost of the electromagnet and miniaturizing the electromagnet. Moreover, each conductive line of the flexible circuit board is prepared by forming the two metallic layers on the two opposite surfaces of the substrate, so the etching depth of each conductive line can be reduced, thereby effectively improving the manufacturing process of each conductive line.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:
1. An electromagnet, comprising:
   an ring-shaped core; and
   a flexible circuit board, comprising:
      a substrate including two carrying segments and a connecting segment, wherein the connecting segment connects the two carrying segments; and
      a circuit unit formed on the substrate and including a plurality of conductive lines and a connecting line, wherein each conductive line and the connecting line are independent lines, the conductive lines are respectively formed on the two carrying segments, and the connecting segment is formed on the connecting segment and the two carrying segments;

wherein the number of the conductive lines formed on each one of the carrying segments is several, wherein the two opposite end portions of each one of the carrying segments include a first end portion and an opposite second end portion, the first end portions and the second end portions of the substrate are arranged in two rows, and each one of the carrying segments is bendable to overlap the first end portion onto the second end portion thereof; each conductive line is arranged from the first end portion to the second end portion of the corresponding carrying segment, and the connecting line is arranged from the first end portion of one of the two carrying segments to the second end portion or the first end portion of the other carrying segment through the connecting segment, wherein each one of the conductive lines includes a first welding pad and a second welding pad arranged at two opposite ends thereof, the first welding pad and the second welding pad of each one of the conductive lines are respectively formed on the first end portion and the second end portion of the corresponding carrying segment; wherein each one of the conductive lines defines a virtual line passing through the first welding pad and the second welding pad thereof, and each virtual line and a longitudinal direction of the corresponding carrying segment have an acute angle, wherein the two carrying segments and the connecting segment are formed in an H shape, wherein the two opposite end portions of each carrying segment are connected to each other to construct a tubular structure, and two opposite ends of the connecting line are respectively connected to two adjacent conductive lines respectively formed on the two tubular structures, so the conductive lines and the connecting line are in a series connection to construct a coil;

wherein the tubular structures are sleeved at the core, and the coil is wound around the core, wherein the coil is configured to receive a current for making the core to have magnetism.

2. The electromagnet as claimed in claim 1, wherein each one of the conductive lines includes two metallic layers and at least one connecting portion connecting the two metallic layers, the two metallic layers of each one of the conductive lines are respectively formed on two opposite surfaces of the substrate, and the at least one connecting portion of each one of the conductive lines is embedded in the substrate.

3. The electromagnet as claimed in claim 2, wherein the metallic layers of each one of the conductive lines are only connected to the substrate and the corresponding connecting portion, and a thickness of the flexible circuit board is 100 µm~150 µm.

4. The electromagnet as claimed in claim 2, wherein the flexible circuit board includes a bonding layer, the bonding layer is formed on one of the two opposite surfaces of the substrate to cover the corresponding metallic layers, and a thickness of the flexible circuit board is 125 µm~175 µm.

5. The electromagnet as claimed in claim 2, wherein the flexible circuit board includes two bonding layers respectively formed on the two opposite surfaces of the substrate, the metallic layers of the conductive lines are embedded in the two bonding layers, and a thickness of the flexible circuit board is 150 µm~200 µm.

6. The electromagnet as claimed in claim 1, wherein the connecting segment is arranged inside the core and faces toward an inner wall of the core.

7. The electromagnet as claimed in claim 1, wherein the conductive lines formed on each one of the tubular structures are connected one by one in an end-to-end connection to construct a spiral shape.

8. The electromagnet as claimed in claim 7, wherein the first welding pad of one of two adjacent conductive lines formed on the same carrying segment is connected to the second welding pad of the other conductive line.

9. A flexible circuit board, comprising:

a substrate including two carrying segments and a connecting segment, wherein the connecting segment connects the two carrying segments; and a circuit unit formed on the substrate and including a plurality of conductive lines and a connecting line, wherein each conductive line and the connecting line are independent lines, the conductive lines are respectively formed on the two carrying segments, and the connecting segment is formed on the connecting segment and the two carrying segments;

wherein two opposite end portions of each carrying segment are configured to connect to each other to construct a tubular structure, and two opposite ends of the connecting line are configured to respectively connect to two adjacent conductive lines respectively formed on the two tubular structures, so the conductive lines and the connecting line are configured in a series connection to construct a coil, wherein the number of the conductive lines formed on each one of the carrying segments is several, wherein the two opposite end portions of each one of the carrying segments include a first end portion and an opposite second end portion, the first end portions and the second end portions of the substrate are arranged in two rows, and each one of the carrying segments is bendable to overlap the first end portion onto the second end portion thereof; each conductive line is arranged from the first end portion to the second end portion of the corresponding carrying segment, and the connecting line is arranged from the first end portion of one of the two carrying segments to the second end portion or the first end portion of the other carrying segment through the connecting segment, wherein each one of the conductive lines includes a first welding pad and a second welding pad arranged at two opposite ends thereof, the first welding pad and the second welding pad of each one of the conductive lines are respectively formed on the first end portion and the second end portion of the corresponding carrying segment; wherein each one of the conductive lines defines a virtual line passing through the first welding pad and the second welding pad thereof, and each virtual line and a longitudinal direction of the corresponding carrying segment have an acute angle, and wherein the two carrying segments and the connecting segment are formed in an H shape.

10. The flexible circuit board as claimed in claim 9, wherein each one of the conductive lines includes two metallic layers and at least one connecting portion connecting the two metallic layers, the two metallic layers of each one of the conductive lines are respectively formed on two opposite surfaces of the substrate, and the at least one connecting portion of each one of the conductive lines is embedded in the substrate; the metallic layers of each one of the conductive lines are only connected to the substrate and the corresponding connecting portion, and a thickness of the flexible circuit board is 100 μm~150 μm.

\* \* \* \* \*